(12) United States Patent
Tu et al.

(10) Patent No.: US 9,647,178 B2
(45) Date of Patent: May 9, 2017

(54) PACKAGE STRUCTURE OF OPTICAL MODULE HAVING PRINTED SHIELDING LAYER AND ITS METHOD FOR PACKAGING

(71) Applicant: Lingsen Precision Industries, Ltd., Taichung (TW)

(72) Inventors: Ming-Te Tu, Taichung (TW); Yao-Ting Yeh, Taichung (TW)

(73) Assignee: Lingsen Precision Industries, Ltd., Taichung (TW)

( * ) Notice: Subject to any disclaimer, the term of this patent is extended or adjusted under 35 U.S.C. 154(b) by 0 days.

(21) Appl. No.: 14/072,320

(22) Filed: Nov. 5, 2013

(65) Prior Publication Data

US 2015/0028378 A1 Jan. 29, 2015

(30) Foreign Application Priority Data

Jul. 25, 2013 (TW) .............................. 102126686 A

(51) Int. Cl.
*H01L 33/48* (2010.01)
*H01L 25/16* (2006.01)
*H01L 33/58* (2010.01)

(52) U.S. Cl.
CPC ............ *H01L 33/48* (2013.01); *H01L 25/167* (2013.01); *H01L 33/58* (2013.01);
(Continued)

(58) Field of Classification Search
CPC ... H01L 25/165; H01L 25/167; H01L 31/125; H01L 31/0203
(Continued)

(56) References Cited

U.S. PATENT DOCUMENTS 3,757,511 A * 9/1973 Burgess et al. ................ 368/83
2005/0009239 A1* 1/2005 Wolff et al. ................... 438/123
(Continued)

FOREIGN PATENT DOCUMENTS

JP 3172668 U * 1/2012 .......... H01L 25/167
TW M399313 3/2011

OTHER PUBLICATIONS

Merriam-Webster Dictionary online—definition of "fill."*
(Continued)

*Primary Examiner* — Michael Jung
*Assistant Examiner* — Mikka Liu
(74) *Attorney, Agent, or Firm* — Muncy, Geissler, Olds & Lowe, P.C.

(57) ABSTRACT

A package structure of an optical module includes: a substrate having a frame defined with a light-emitting region and a light-admitting region; a light-emitting chip disposed at the light-emitting region of the substrate; a light-admitting chip disposed at the light-admitting region of the substrate; two encapsulants formed in the frame and enclosing the light-emitting chip and the light-admitting chip, respectively; and a shielding layer formed on the frame and the encapsulants and having a light-emitting hole and a light-admitting hole, wherein the light-emitting hole and the light-admitting hole are positioned above the light-emitting chip and the light-admitting chip, respectively. The optical module package structure uses an opaque glue to reduce costs and total thickness of the package structure.

5 Claims, 2 Drawing Sheets

(52) U.S. Cl.
CPC ............... *H01L 2224/48091* (2013.01); *H01L 2224/73265* (2013.01); *H01L 2924/0002* (2013.01)

(58) Field of Classification Search
USPC .......................................................... 257/82
See application file for complete search history.

(56) References Cited

U.S. PATENT DOCUMENTS

| | | | |
|---|---|---|---|
| 2005/0263786 A1* | 12/2005 | Isoda .................... | H01L 33/486 257/100 |
| 2006/0284198 A1* | 12/2006 | Huang ............................ | 257/98 |
| 2008/0219673 A1* | 9/2008 | Goh et al. ..................... | 398/135 |
| 2010/0163892 A1* | 7/2010 | Liu ................................. | 257/89 |
| 2010/0181578 A1* | 7/2010 | Li et al. ........................ | 257/82 |
| 2011/0249215 A1* | 10/2011 | Jung et al. ...................... | 349/61 |
| 2012/0025211 A1* | 2/2012 | Yeh et al. ....................... | 257/82 |
| 2012/0138997 A1* | 6/2012 | Tasaki .................. | G02B 5/0808 257/98 |
| 2012/0290255 A1* | 11/2012 | Kelkar et al. ................. | 702/150 |
| 2013/0037702 A1* | 2/2013 | Minamikawa ........ | H01L 25/167 250/221 |
| 2014/0340286 A1* | 11/2014 | Machida et al. .................. | 345/8 |

OTHER PUBLICATIONS

Free Dictionary online—definition of "flush."*
Japanese Patent Publication No. JP 3172668 U. Publication Date: Jan. 5, 2012. Retrieved from Japan Patent Office website on Jul. 1, 2016.*

* cited by examiner

PACKAGE STRUCTURE OF OPTICAL MODULE HAVING PRINTED SHIELDING LAYER AND ITS METHOD FOR PACKAGING

BACKGROUND OF THE INVENTION

1. Technical Field

The present invention relates to package structures, and more particularly, to a package structure of an optical module.

2. Description of Related Art

At present, an optical proximity sensing module is regarded as a mainstream technology choice for use with the new-generation smart electronic devices (such as smartphones). If the electronic device is brought close to the human ear (for face recognition) or put in a pocket, the optical proximity sensing module will turn off the screen display of the electronic device right away to save power and prevent an inadvertent touch on the screen display, thereby enhancing ease of use. The optical proximity sensing module comprises a light-emitting chip (such as a light-emitting diode, LED) for emitting a light beam. The light beam reflects off an object surface to fall on a light-admitting chip and convert into an electronic signal for subsequent processing. For instance, Taiwan patent M399313 discloses a proximity sensing package structure which comprises a base, a dam extending vertically and enclosing the base, and a lid disposed on the dam, so as to form a receiving space, wherein the receiving space has therein a partition board for dividing the receiving space, such that a light-emitting chip and a light-admitting chip can be separately disposed on a substrate to shun mutual light beam-related interference which might otherwise result in deterioration of product performance.

However, smart electronic devices nowadays have a trend toward reduction of thickness. The packaging process of the aforesaid patent requires that a lid be fixed to a dam and a partition board from above; as a result, evidently, the package structure incurs high material costs. Furthermore, the lid is of a considerable thickness, which restrains the extent of reduction in the total package structure height.

SUMMARY OF THE INVENTION

It is an objective of the present invention to provide a package structure of an optical module to cut costs and reduce total package structure thickness effectively.

In order to achieve the above and other objectives, the present invention provides a package structure of an optical module, comprising: a substrate having a frame defined with a light-emitting region and a light-admitting region; a light-emitting chip disposed at the light-emitting region of the substrate; a light-admitting chip disposed at the light-admitting region of the substrate; two encapsulants formed in the frame and enclosing the light-emitting chip and the light-admitting chip, respectively; and a shielding layer formed on the frame and the encapsulants and having a light-emitting hole and a light-admitting hole, wherein the light-emitting hole and the light-admitting hole are positioned above the light-emitting chip and the light-admitting chip, respectively.

The shielding layer is formed by printing or transfer printing.

The shielding layer is made of an opaque plastic.

The encapsulants are made of a transparent silica gel.

The substrate is a non-ceramic substrate made of an organic material, such as Bismaleimide Triazine.

The present invention further provides a method for packaging an optical module. The method comprises the steps of:

(a) defining the light-emitting region and the light-admitting region on the substrate;

(b) forming the frame on the substrate;

(c) connecting electrically the light-emitting chip and the light-admitting chip to the substrate;

(d) filling the frame with a transparent encapsulant for covering the light-emitting chip and the light-admitting chip; and (e) forming an opaque shielding layer on the frame and the encapsulant by printing or transfer printing.

The electrical connection step is achieved by a wire bonding process and a die attaching process.

Hence, the present invention provides a package structure of an optical module, wherein a light-emitting hole and a light-admitting hole are formed by means of an opaque glue to shield portions of a light-emitting chip and a light-admitting chip, thereby reducing packaging costs and total thickness.

To enable persons skilled in the art to gain insight into the framework, features, and objectives of the present invention and implement the present invention accordingly, the present invention is hereunder illustrated with a preferred embodiment and the accompanying drawings and described in detail. However, the description below is merely intended to illustrate the technical solution and features of the present invention and the embodiment thereof. All simple modifications, replacements, or constituent component sparing made, without going against the spirit of the present invention, by persons skilled in the art after understanding the technical solution and features of the present invention should fall within the claims of the present invention.

BRIEF DESCRIPTION OF THE SEVERAL VIEWS OF THE DRAWINGS

The structure, features, and advantages of the present invention are hereunder illustrated with a preferred embodiment in conjunction with the accompanying drawings, in which.

DETAILED DESCRIPTION OF THE EMBODIMENT OF THE INVENTION

Figure 1:
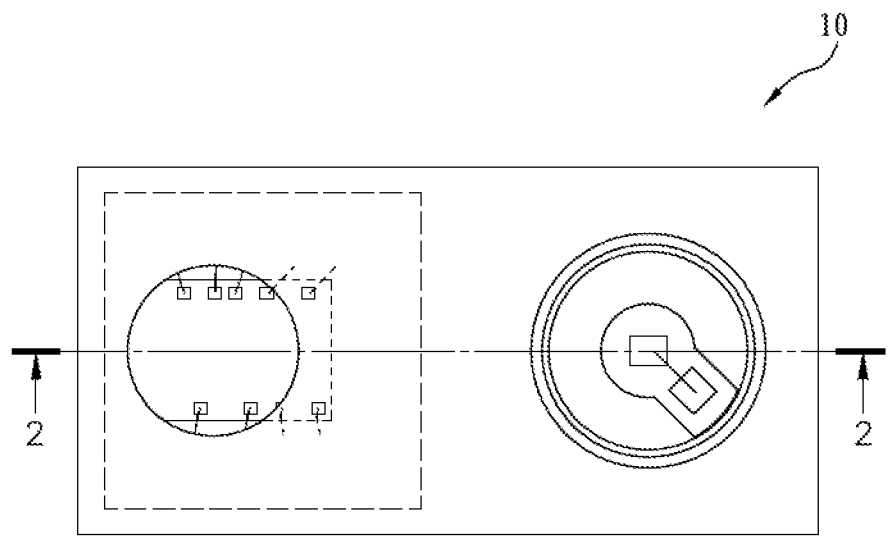
FIG. 1 is a top view of an optical module package structure according to a preferred embodiment of the present invention.
Figure 2:
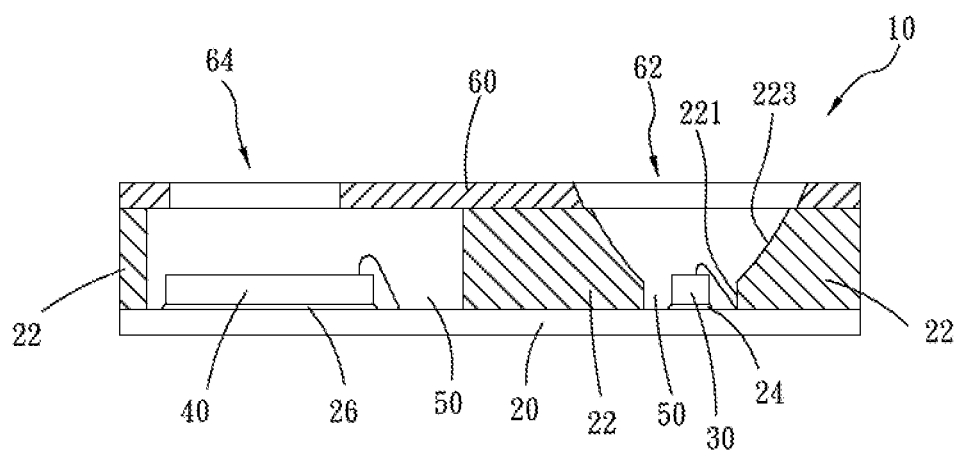
FIG. 2 is a cross-sectional view of the optical module package structure taken along line 2-2 of FIG. 1 according to the preferred embodiment of the present invention.
Figure 3:
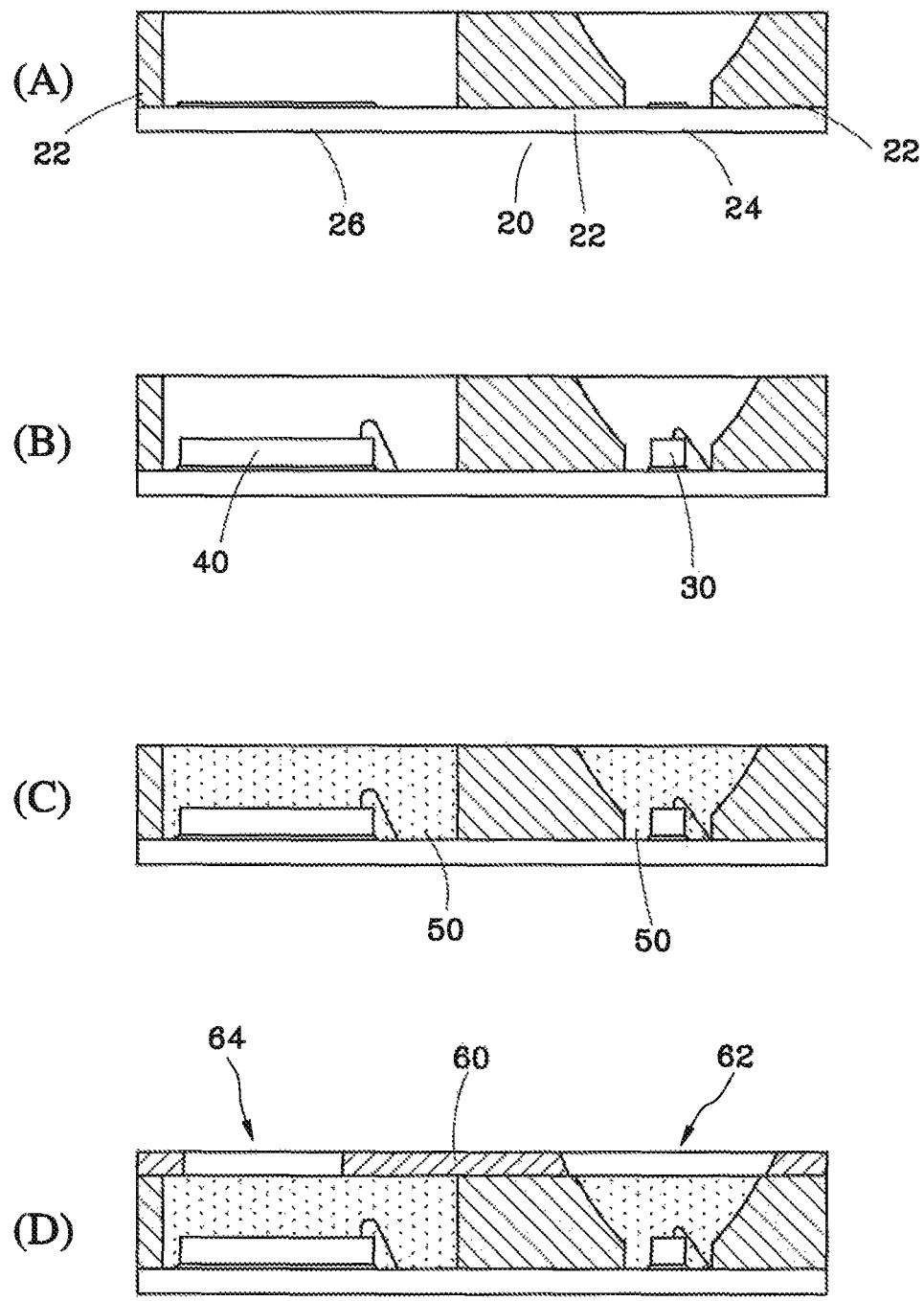
FIG. 3 is a schematic view of the process flow of a packaging method according to the preferred embodiment of the present invention.

Referring to FIG. 1 through FIG. 3, an optical module package structure 10 provided according to a preferred embodiment of the present invention comprises a substrate 20, a light-emitting chip 30, a light-admitting chip 40, two encapsulants 50, and a shielding layer 60

The substrate 20 is a non-ceramic substrate made of an organic material, such as Bismaleimide Triazine. The substrate 20 has a frame 22. The frame 22 is defined with a light-emitting region 24 and a light-admitting region 26.

The light-emitting chip 30 is disposed at the light-emitting region 24 of the substrate 20.

The light-admitting chip 40 is disposed at the light-admitting region 26 of the substrate 20.

The encapsulants 50 are made of a transparent silica gel and formed in the frame 22 to enclose the light-emitting chip 30 and the light-admitting chip 40, respectively.

The shielding layer 60 is made of an opaque plastic and formed on the frame 22 and the encapsulants 50 by printing or transfer printing. The shielding layer 60 has a light-emitting hole 62 and a light-admitting hole 64. The light-emitting hole 62 and the light-admitting hole 64 are positioned above the light-emitting chip 30 and the light-admitting chip 40, respectively. The light-emitting region 24 and the light-admitting region 26 are independent from each other. The light-emitting region 24 has a first section adjacent to the substrate 20 and a second section adjacent to the light-emitting hole 62. The first and second sections have a border 221, 223 with the frame 22 which is perpendicular to the substrate 20 in the first section and expands outwardly toward the light-emitting hole in the second section.

Referring to FIG. 3, A through D, there is shown a schematic view of the process flow of optical module packaging according to the present invention. The first step A involves defining the light-emitting region 24 and the light-admitting region 26 on the single substrate 20 of each substrate array and then forming the frame 22 on the substrate 20. In the second step B, the light-emitting chip 30 and the light-admitting chip 40 undergo a die attaching process and a wire bonding process so as to be disposed at the light-emitting region 24 and light-admitting region 26 of the substrate 20, respectively, In the third step C, the frame 22 is filled with a transparent the encapsulants 50, such that the encapsulants 50 cover the light-emitting chip 30 and the light-admitting chip 40 to not only reduce the transmission loss and distortion of the light beam being transmitted from the light-emitting chip 30 to the light-admitting chip 40 but also protect the chips 30, 40. In the fourth step F, the opaque shielding layer 60 With the light-emitting hole 62 and the light-admitting hole 64 is formed on the frame 22 and the encapsulants 50 by printing or transfer printing, wherein the light-emitting hole 62 and the light-admitting hole 64 are positioned above the light-emitting chip 30 and the light-admitting chip 40, respectively. Hence, the present invention is characterized in that: an opaque shielding layer 60 is formed by printing or transfer printing; given the shielding layer 60 with the light-emitting hole 62 and the light-admitting hole 64, different portions of the encapsulants 50 are displayed and shielded, respectively, such that the optical module package structure 10 features reduced costs and total thickness.

In conclusion, the light beam emitted from the light-emitting chip 30 of an optical module package structure 10 passes through the encapsulants 50, penetrates the light-emitting hole 62 of the shielding layer 60, and falls on the surface of an object, such that the light beam reflected off the surface of the object is admitted to the light-admitting hole 64 of the shielding layer 60 before entering the encapsulants 50. Afterward, the focused light beam falls on the light-admitting chip 40. Eventually, the light-admitting chip 40 converts a received light signal into an electronic signal for subsequent computation. The present invention is characterized in that, during the process of emitting and receiving the light beam, each of the light-emitting chip 30 and the light-admitting chip 40 is positioned in independent space to avoid mutual interference resulting from receiving and transmitting the light beam. In addition, the shielding layer 60 is an opaque glue and formed by printing or transfer printing. The light-emitting hole 62 and the light-admitting hole 64 of the shielding layer 60 shield portions of the encapsulants 50, such that the optical module package structure 10 not only keeps the predefined effect of the optical emission and reception, but reduces the packaging cost and total structural thickness.

Constituent elements disclosed in the aforesaid embodiment of the present invention are illustrative rather than restrictive of the present invention. The replacements or changes of other equivalent: elements should still fall within the appended claims of the present invention.

What is claimed is:

1. A method for packaging an optical module, the method comprising the steps of:
   (a) defining a light-emitting region and a light-admitting region on a substrate;
   (b) after step (a), forming a frame with a flat top surface on the substrate;
   (c) after step (b), connecting electrically a light-emitting chip and a light-admitting chip to the substrate;
   (d) after step (c), filling the frame with a transparent encapsulant having a flat top surface flush with the flat top surface of the frame for covering the light-emitting chip and the light-admitting chip; and
   (e) after step (d), forming an opaque printed shielding layer on the flat top surface of the frame and the flat top surface of the encapsulant by one of printing and transfer printing;
   wherein the light-emitting region and the light-admitting region are independent from each other; the light-emitting region has a first section adjacent to the substrate and a second section adjacent a light-emitting hole, the first and second sections having a border with the frame which is perpendicular to the substrate in the first section and expands outwardly toward the light-emitting hole in the second section.

2. The method of claim 1, wherein the electrical connection step is achieved by a wire bonding process and a die attaching process.

3. The method of claim 1, wherein the substrate is made of Bismaleimide Triazine.

4. The method of claim 1, wherein the shielding layer is an opaque glue.

5. The method of claim 1, wherein the shielding layer shields portions of the encapsulant.

* * * * *